United States Patent
Masumoto

(10) Patent No.: US 7,847,399 B2
(45) Date of Patent: Dec. 7, 2010

(54) SEMICONDUCTOR DEVICE HAVING SOLDER-FREE GOLD BUMP CONTACTS FOR STABILITY IN REPEATED TEMPERATURE CYCLES

(75) Inventor: Mutsumi Masumoto, Beppu (JP)

(73) Assignee: Texas Instruments Incorporated, Dallas, TX (US)

( * ) Notice: Subject to any disclaimer, the term of this patent is extended or adjusted under 35 U.S.C. 154(b) by 496 days.

(21) Appl. No.: 11/952,836

(22) Filed: Dec. 7, 2007

(65) Prior Publication Data

US 2009/0146298 A1 Jun. 11, 2009

(51) Int. Cl.
*H01L 23/48* (2006.01)
*H01L 23/52* (2006.01)

(52) U.S. Cl. .......... 257/737; 257/778; 257/772; 257/E23.021

(58) Field of Classification Search .......... 257/737, 257/778, 772, E23.021
See application file for complete search history.

(56) References Cited

U.S. PATENT DOCUMENTS

| | | | | |
|---|---|---|---|---|
| 5,616,958 A | * | 4/1997 | Laine et al. | 257/717 |
| 5,892,271 A | * | 4/1999 | Takeda et al. | 257/668 |
| 6,130,479 A | * | 10/2000 | Chalco et al. | 257/734 |
| 6,140,707 A | * | 10/2000 | Plepys et al. | 257/778 |
| 6,441,488 B1 | * | 8/2002 | Smith | 257/738 |
| 6,669,077 B1 | * | 12/2003 | Kawashima et al. | 228/180.21 |
| 7,233,074 B2 | | 6/2007 | Ano | |
| 2003/0234453 A1 | * | 12/2003 | Liu et al. | 257/778 |
| 2004/0262778 A1 | * | 12/2004 | Hua | 257/778 |
| 2006/0113683 A1 | * | 6/2006 | Dean et al. | 257/783 |
| 2008/0292492 A1 | * | 11/2008 | Ingham et al. | 420/561 |

* cited by examiner

*Primary Examiner*—Nitin Parekh
(74) *Attorney, Agent, or Firm*—Yingsheng Tung; Wade J. Brady, III; Frederick J. Telecky, Jr.

(57) ABSTRACT

A semiconductor device has a chip (101) with gold studs (212) assembled on a tape substrate (102), which has solder balls (103) for attachment to external parts. The tape substrate (about 30 to 70 μm thick) has on its first surface first copper contact pads (221) covered with a continuous thin nickel layer (222) of about 0.04 to 0.12 μm thickness. Gold including stud (212) is contacting the nickel. On the second substrate surface are second copper contact pads (231) covered with an alloy layer (about 2 to 3 μm thick) including gold, copper/tin alloys, and copper/nickel/tin alloys; the alloys are metallurgically attached to the second copper pad and substantially free of unalloyed nickel. A reflow body (103) comprising tin is metallurgically attached to the alloy layer of each second pad.

14 Claims, 3 Drawing Sheets

FIG. 2

SEMICONDUCTOR DEVICE HAVING SOLDER-FREE GOLD BUMP CONTACTS FOR STABILITY IN REPEATED TEMPERATURE CYCLES

FIELD OF THE INVENTION

The present invention is related in general to the field of semiconductor devices and processes, and more specifically to metallurgical systems for stable gold bump connections with and without solder.

DESCRIPTION OF RELATED ART

The growing popularity of flip-chip assembly in the fabrication process flow of silicon integrated circuit (IC) devices is driven by several facts. First, the electrical performance of the semiconductor devices can be improved when the parasitic inductances correlated with conventional wire bonding interconnection techniques are reduced. Second, flip-chip assembly provides higher interconnection densities between chip and package than wire bonding. Third, flip-chip assembly consumes less silicon "real estate" than wire bonding, and thus helps to conserve silicon area and reduce device cost. And fourth, the fabrication cost can be reduced, when concurrent gang-bonding techniques are employed rather than consecutive individual bonding steps.

In order to reduce bump size and bump pitch, efforts were undertaken to replace the earlier solder-based interconnecting balls with gold bumps, especially by an effort to create gold bumps by a modified wire ball technique. Typically, the gold bumps are created on an aluminum layer of the contact pads of semiconductor chips. Subsequently, the chips are attached to substrates using solder.

For many contemporary products, such as wireless telephones, the substrates with the attached chips have to be assembled on printed circuits or motherboards, and subsequently have to be tested in temperature cycles from ambient temperature to significantly elevated temperatures. For solder of pure tin or tin alloys, without lead, temperatures as high as 280° C. may be involved. It has been found routinely that solder-attached gold bumps fare poorly in these temperature excursions; the electrical resistance of the gold-solder contacts increases rapidly, or the gold bump dissolves in the molten solder alloy, or the contacts open altogether after only three or four temperature cycles.

SUMMARY OF THE INVENTION

Applicant conducted a metallurgical and statistical investigation of gold bump contact structures, with and without solder. The investigation discovered that gold bumps can be attached to gold layers over copper contacts without solder, when ultrasonic energy is employed and the support of a thin nickel layer between gold and copper is enlisted.

Extensive life tests further found that these gold-on-copper contacts exhibit only few percent (about 5 to 9%) changes in electrical resistance after ten or more temperature cycles up to the melting temperature (about 260° C.) of lead-free tin alloys, compared to the resistance right after the chip assembly. This result contrasts favorably with conventional life test results, which typically show a 5 to 10 fold increase of contact resistance or frequently a complete loss of contact (electrical open). In the analysis of the gold contacts, applicant discovered that the nickel layer diffused only slightly into the adjoining regions of gold and copper, and showed no change after device storage at 150° C. for 1000 hours.

One embodiment of the invention is a semiconductor device with a chip with gold studs, which is assembled on a tape substrate with solder balls for attachment to external parts. The tape substrate (about 30 to 70 μm thick) has on its first surface first copper contact pads covered with a continuous thin nickel layer of about 0.04 to 0.12 μm thickness. Gold including the stud is contacting the nickel. On the second substrate surface are second copper contact pads covered with an alloy layer (about 2 to 3 μm thick) including gold, copper/tin alloys, and copper/nickel/tin alloys; the alloys are metallurgically attached to the second copper pad and substantially free of unalloyed nickel. A reflow body comprising tin is metallurgically attached to the alloy layer of each second pad.

Another embodiment of the invention a method for assembling a semiconductor device with a chip with gold studs. A tape is provided with copper contact pads on the first and the second surface. The copper pads on both surfaces have a thin nickel layer (identical thickness about 0.04 to 0.12 μm) over the copper and a gold layer over the nickel; the contact locations on one tape surface match the chip gold studs. The tape is put into a frame to maintain flatness; the frame is then loaded on a machine with a surface to support the flat tape. The chip gold studs are pressed onto the matching gold layers of the first surface contacts, and ultrasonic energy with suitable amplitude, time, and temperature is applied to create gold-to-gold interdiffusion contact without breaking the nickel layer. Solder bodies are then attached to the contacts of the second surface; in the reflow process, an alloy layer is created including gold, copper/tin alloys, and copper nickel/tin alloys substantially free of unalloyed nickel. The spaces between the studs attached to the substrate may be filled with a polymeric precursor, and the assembled chip and the first substrate surface may be covered with an encapsulation compound forming the package for the device.

The technical advances represented by certain embodiments of the invention will become apparent from the following description of the preferred embodiments of the invention, when considered in conjunction with the accompanying drawings and the novel features set forth in the appended claims.

DETAILED DESCRIPTION OF THE PREFERRED EMBODIMENTS

Figure 1:
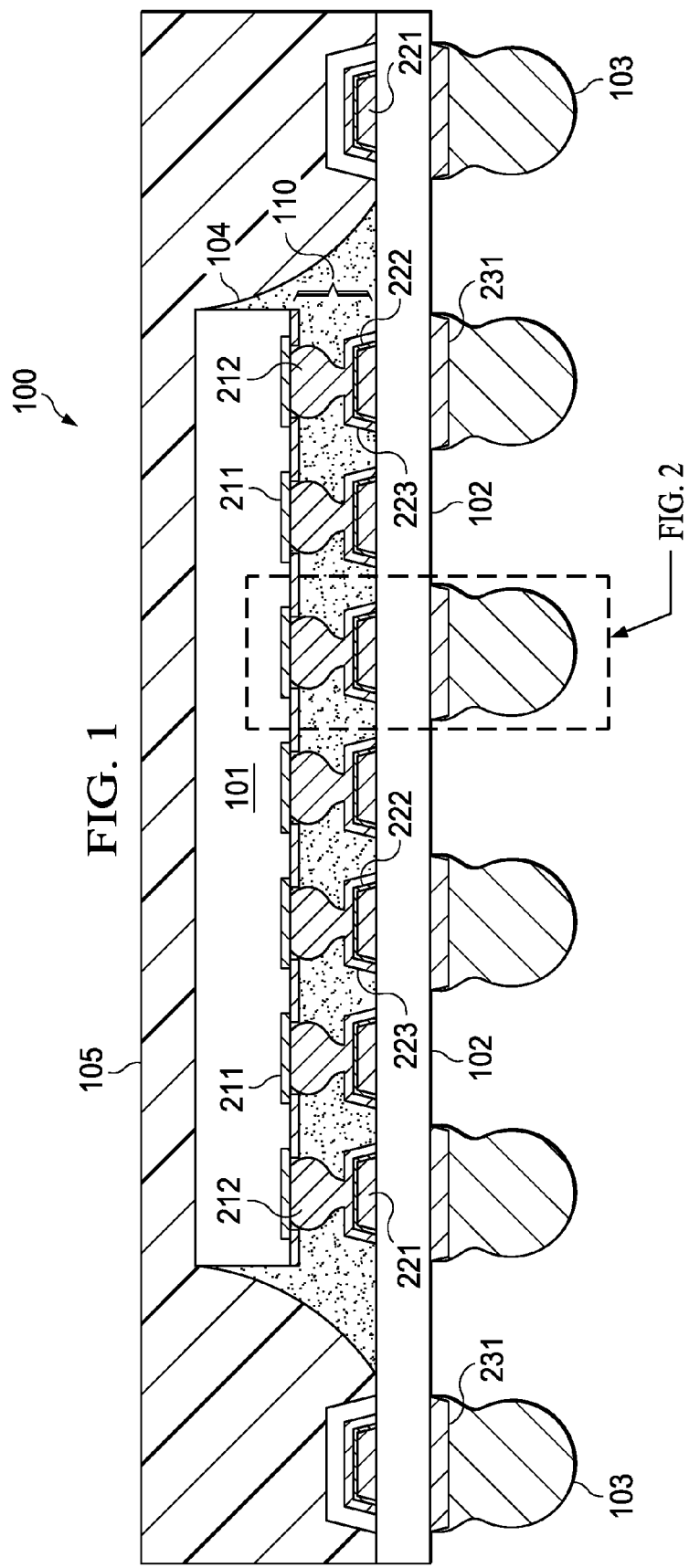
FIG. 1 shows a schematic cross section of a packaged semiconductor device with a substrate according to the invention.

An embodiment of the invention is a metallic interconnect structure 110 for connecting a gold stud to a copper contact pad without the use of solder. FIG. 1 illustrates a packaged semiconductor device, generally designated 100, which includes a plurality of interconnect structures 110. A semiconductor chip 101 is assembled on a substrate 102 using these interconnect structures. Device 100 of FIG. 1 has a single chip 101; in other embodiments, there may be more than one chip, or one or more stacks of chips. Attached to the substrate on the surface opposite to the chip are reflow bodies 103, which are suitable for connection to external parts. Device 100 further includes a polymeric precursor 104, which fills the spaces between the interconnect structures, and an encapsulation compound 105 for protecting the assembled chip. In some embodiments, precursor 104 is not needed, because it is replaced by compound 105; in still other embodiments, compound 105 is not needed.

Figure 2:
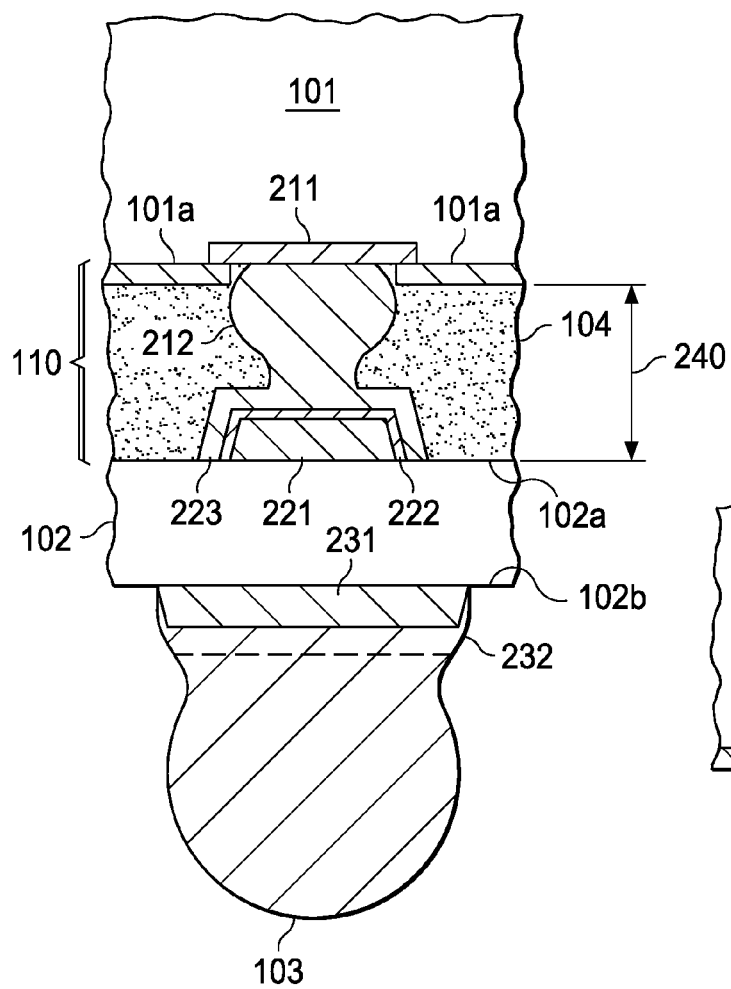
FIG. 2 illustrates a portion of the device of FIG. 1, magnifying the layered structure of a substrate copper contact pad, which is contacted by the gold stud of the semiconductor chip.

A portion of device 100, which includes a metallic interconnect structure 110 and an attached reflow body 103 is marked by dashed lines and magnified in FIG. 2. Chip 101 has terminals 211, which are preferably made of aluminum or an aluminum alloy; alternatively, terminals 211 may be made of copper with a surface layer of aluminum. A gold stud 212 is metallurgically attached to each terminal 211. Methods for creating and attaching the gold studs are described below. Alternatively, a patterned gold layer may provide the interconnection means.

FIG. 2 further shows a portion of substrate 102, on which the chip is assembled. Substrate 102 is preferably a single layer tape; suitable materials include polyimide-type polymers. Alternatively, substrate 101 may be a laminate sheet. The preferred thickness range of substrate 102 is between about 30 and 70 µm. Substrate tape 102 has a first surface 102$a$ and a second surface 102$b$ opposite to the first surface.

As FIG. 2 illustrates, the first substrate surface 102$a$ has first copper contact pads 221. Contiguous with each pad 221 is a nickel layer 222, which is thin and continuous; the preferred thickness range of layer 222 is between about 0.04 and 0.12 µm, most preferably about 0.08 µm. Contiguous with nickel layer 222 is a gold region, which includes stud 212 and extensions 223 (see below the process description of metallurgically merging the original stud and an original layer 223).

The second substrate surface 102$b$ has second copper contact pads 231, to which solder body 103 is attached. In many embodiments, second pads 231 have the same thickness as first pads 221, but a different size; in some embodiments, however, second pads 231 may also have the same size as first pads 221. Pads 231 are covered with an alloy layer 232, which has a thickness between about 2.0 and 3.0 µm and is metallurgically attached to copper pads 231. Alloy layer 232 includes gold, copper/tin alloys, and copper/nickel/tin alloys. The dominant alloy of layer 232 comprises the intermetallic compound (Cu, Ni, Au) 6Sn5. Alloy layer 232 is substantially free of unalloyed nickel. Metallurgically attached to alloy layer 232 is reflow body 101, which is preferably a tin-based solder ball. The method of fabricating the attachment of reflow body 103 to copper pad 231 and the alloy layer 232 is described below.

Figure 3:
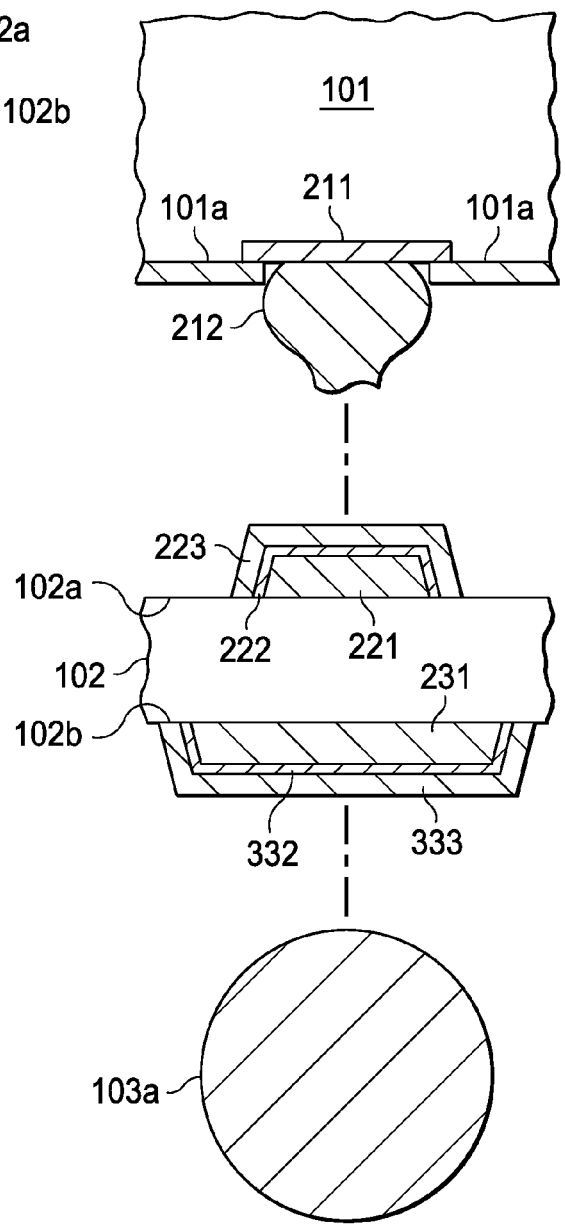
FIG. 3 depicts the parts used for the assembly of the device portion in FIG. 2, illustrating the layered structure of the copper contact pads on both surfaces of the substrate.

Another embodiment of the invention is a method for assembling a semiconductor device, wherein the method provides the steps of attaching a semiconductor chip with gold studs (or alternatively copper studs) onto the copper contact pads of a substrate without the means of solder. Referring to the portions of the chip and substrate shown in FIG. 3, the semiconductor chip 101 has an insulating overcoat 101$a$ (for example, silicon nitride or oxynitride) with a window in the overcoat. The window exposes a portion of chip metallization 211, which is preferably aluminum or aluminum alloy with a surface bondable to gold (or alternatively to copper). Alternatively, metallization 211 may be made of copper; again, the surface of pad 211 needs to be bondable to gold. For example, the surface of pad 211 may have a thin layer of aluminum, gold or palladium. The exposed metal in the window serves as a pad for electrical and mechanical contact to chip 101.

Attached to contact pad 211 is a stud, or bump, 212, preferably made of gold or a gold alloy (alternatively, made of copper). Due to the fabrication method, stud 212 may have the shape of a deformed sphere. At the interface between gold and aluminum is a layer of gold/aluminum intermetallics. The preferred method for fabricating stud 212 is a modified ball bonding technique; it is described for gold wires, but may be modified for copper wires. A wire bonder with a capillary is selected suitable for round gold wires in the diameter range between 15 and 33 µm, preferably 20 to 25 µm. For subsequent bonding to aluminum pads and controlling the heat-affected zone in ball formation, the wire may include small contents of beryllium, copper, palladium, iron, silver, calcium or magnesium. From the length of the gold wire protruding from the capillary, a free air ball is formed using either a flame or a spark technique. The ball has a size with a preferred diameter from about 1.2 to 1.6 wire diameters, for example, between about 20 and 30 µm.

For bonding gold to aluminum, the semiconductor chip is positioned on a heated pedestal heated to a temperature between 150 and 300° C. The free air ball is placed on the pad 211 and pressed against the metallization of the pad. For pads of aluminum, a combination of compression force and ultrasonic energy creates the formation of gold-aluminum intermetallics and a strong metallurgical bond. The compression force is between about 17 and 75 g; the ultrasonic time between about 10 and 20 ms, the ultrasonic power between about 20 and 50 mW. At time of bonding, the temperature usually ranges from 150 to 270° C. The squeezed gold bump 211 looks like a deformed sphere.

The capillary is lifted and the wire is broken off from the squeezed sphere in the heat-affected mechanically weak zone. The wire stump remaining of the squeezed ball may be coined to flatten it. Dependent on the shape of the capillary orifice, stud 212 may have an additional truncated cone with a flat top.

For the device fabrication according to the invention (see FIG. 3), a tape 102 is provided, which has a first and a second surface (102$a$ and 102$b$, respectively). It is preferred that the tape is a single-layer tape, preferably made of a polyimide-based material in the thickness range from about 30 to 70 µm. Alternatively, the substrate may be a laminate material of greater thickness.

The first surface 102$a$ of tape 102 is provided with first copper contact pads 221 in locations, which match the chip gold studs 212. Each first copper pad 221 is covered by a first nickel layer 222, which may be created by electroplating on copper pad 221. Nickel layer 222 is continuous and contiguous with copper pad 221. The preferred thickness range for nickel layer 222 is between about 0.04 and 0.12 µm, with a preferred thickness of about 0.08 µm. A gold layer 223 covers the nickel layer and is contiguous with it. The thickness range of gold layer 223 is between about 0.4 and 0.6 µm, preferably about 0.5 µm.

The second surface 102$b$ of tape 102 provided with second copper contact pads 231, which may have the same thickness as first pads 221, but different area size. The second copper pads 231 are covered by a second nickel layer 332, which is created in the same electroplating process as layer 222. Layer 332 is continuous and contiguous with copper pad 231. Second nickel layer 332 has the first nickel layer thickness (between about 0.04 and 0.12 µm, preferably about 0.08 µm). In addition, a gold layer 333 is covering the nickel layer and is contiguous with it. Gold layer 333 has preferably the thickness of gold layer 223.

In order to attach chip 101 to the first substrate surface 102a, tape 102 is put into a sturdy frame so that tape 102 can be held flat; this flatness is maintained throughout the subsequent process steps. Next, the frame is loaded onto a machine, which has a stage surface to support the flat tape. The machine is a bonder with a flip-chip bonding head capable of operating in ultrasonic mode. Machines with ultrasonic bonding tools are commercially available, for example by Toray Engineering, Japan (FS-3500N).

The temperature of the stage is raised to about 80 to 90° C., and the temperature of the bonding tool is raised to about 140 to 160° C. The preferred ultrasonic frequency is 50 kHz. Applicant has conducted extensive investigations to identify the process conditions, which produce not only defect-free gold-to-gold contacts, but also contacts of a quality remaining stable after at least 1000 hours storage at 150° C., at least 1000 temperature cycles between −55 and +125° C., and ten or more cycles to temperatures around 260° C. As an example of these studies, the ultrasonic process conditions for a 3.5×3.6 mm silicon chip with 195 gold studs to be bonded onto a 10×10 mm polyimide tape are as follows:

The chip gold studs 212 are pressed onto the matching substrate gold layers 223. Preferred pressure is between about 0.1 and 0.2 N, which is equivalent to a force of about 11 to 12 g/stud. Ultrasonic energy is then applied to create gold-to-gold interdiffusion contact between stud 212 and layer 223, without breaking the nickel layer 222. The interdiffusion creates the gold region illustrated in FIGS. 1 and 2. The preferred ultrasonic bonding conditions include a frequency of 50 kHz at amplitude between about 1 to 3 μm; it takes about 0.25 s for the amplitude to reach the peak value. The amplitude is maintained for a time span of about 0.3 to 0.5 s. Under these conditions, the dissipated power is about 3 W, which is equivalent to energy of about 0.9 J.

Similar ultrasonic process conditions were identified for other chips, for instance for a 5.6×5.8 mm silicon chip with 367 gold studs. The ultrasonic process conditions did not cause any detectable damage to any observable feature of the integrated circuits.

After the ultrasonic attachment of the chip is completed, the gap 240 (see FIG. 2) between chip 101 and substrate 102 is about 15 to 20 μm. In order to fill this narrow gap with a polymeric precursor 104 by capillary action, a polymer of low viscosity is preferably used, or the support of a vacuum under filling technique should be employed.

The method may further include the step of covering the assembled chip 101 and the first substrate surface 102a with an encapsulation compound 105 (see FIG. 1), thereby creating a package for the device. A preferred encapsulation technique is molding.

In the next process step, reflow bodies 103a preferably made of tin-based solder are attached to the second substrate surface 102b. The gold layer 233 of each second contact pad is contacted with a solder body 103a. Thermal energy is applied to reach the melting temperature for reflowing the solder. In this process, an alloy layer 232 (see FIG. 2) is created which includes gold, copper/tin alloys, and copper nickel/tin alloys, and has absorbed the original layers 332 and 333. The dominant alloy of this layer 232 is the intermetallic compound (Cu, Ni, Au) 6Sn5. Further, layer 232 is substantially free of regions of unalloyed nickel from the original layer 332.

Applicant's investigations have shown that the electrical resistance of the chip gold studs attached to the first copper contact pads remains approximately constant in 10 consecutive temperature excursions between ambient temperature and 260° C. Table I illustrates the measured resistance (in Ω) of the gold-to-copper contacts in devices A through J at the initial reading (reflow time 0) and after 1 to 10 temperature cycles. For most products 3 or 4 of these temperature excursions are encountered by the product during the solder reflow steps in device assembly.

TABLE 1

Electrical Resistance (Ω) of Gold Studs Attached to Copper Pads, Present Invention

| Sample | Reflow Time | | | | | | | | | | |
|---|---|---|---|---|---|---|---|---|---|---|---|
| | 0 | 1 | 2 | 3 | 4 | 5 | 6 | 7 | 8 | 9 | 10 |
| A | 3.6 | 3.6 | 3.6 | 3.8 | 3.8 | 3.9 | 3.8 | 3.8 | 3.9 | 3.9 | 4 |
| B | 3.6 | 3.6 | 3.6 | 3.8 | 3.9 | 3.9 | 3.8 | 3.9 | 3.9 | 4 | 3.9 |
| C | 3.5 | 3.6 | 3.6 | 3.8 | 3.8 | 3.9 | 3.8 | 3.8 | 3.8 | 3.9 | 4 |
| D | 3.5 | 3.5 | 3.7 | 3.7 | 3.8 | 3.8 | 3.8 | 3.7 | 3.8 | 3.9 | 3.9 |
| E | 3.6 | 3.6 | 3.6 | 3.7 | 3.7 | 3.8 | 3.7 | 3.8 | 3.8 | 3.9 | 3.9 |
| F | 3.6 | 3.6 | 3.6 | 3.7 | 3.8 | 3.8 | 3.7 | 3.8 | 3.8 | 3.9 | 3.9 |
| G | 3.6 | 3.6 | 3.6 | 3.6 | 3.8 | 3.8 | 3.8 | 3.8 | 3.8 | 3.8 | 4.1 |
| H | 3.6 | 3.6 | 3.6 | 3.7 | 3.7 | 3.8 | 3.8 | 3.8 | 3.8 | 3.8 | 3.8 |
| I | 3.6 | 3.6 | 3.6 | 3.8 | 3.8 | 3.7 | 3.7 | 3.8 | 3.8 | 3.8 | 3.9 |
| J | 3.6 | 3.6 | 3.6 | 3.7 | 3.9 | 3.8 | 3.8 | 3.9 | 3.9 | 4 | 3.9 |

Figure 4:
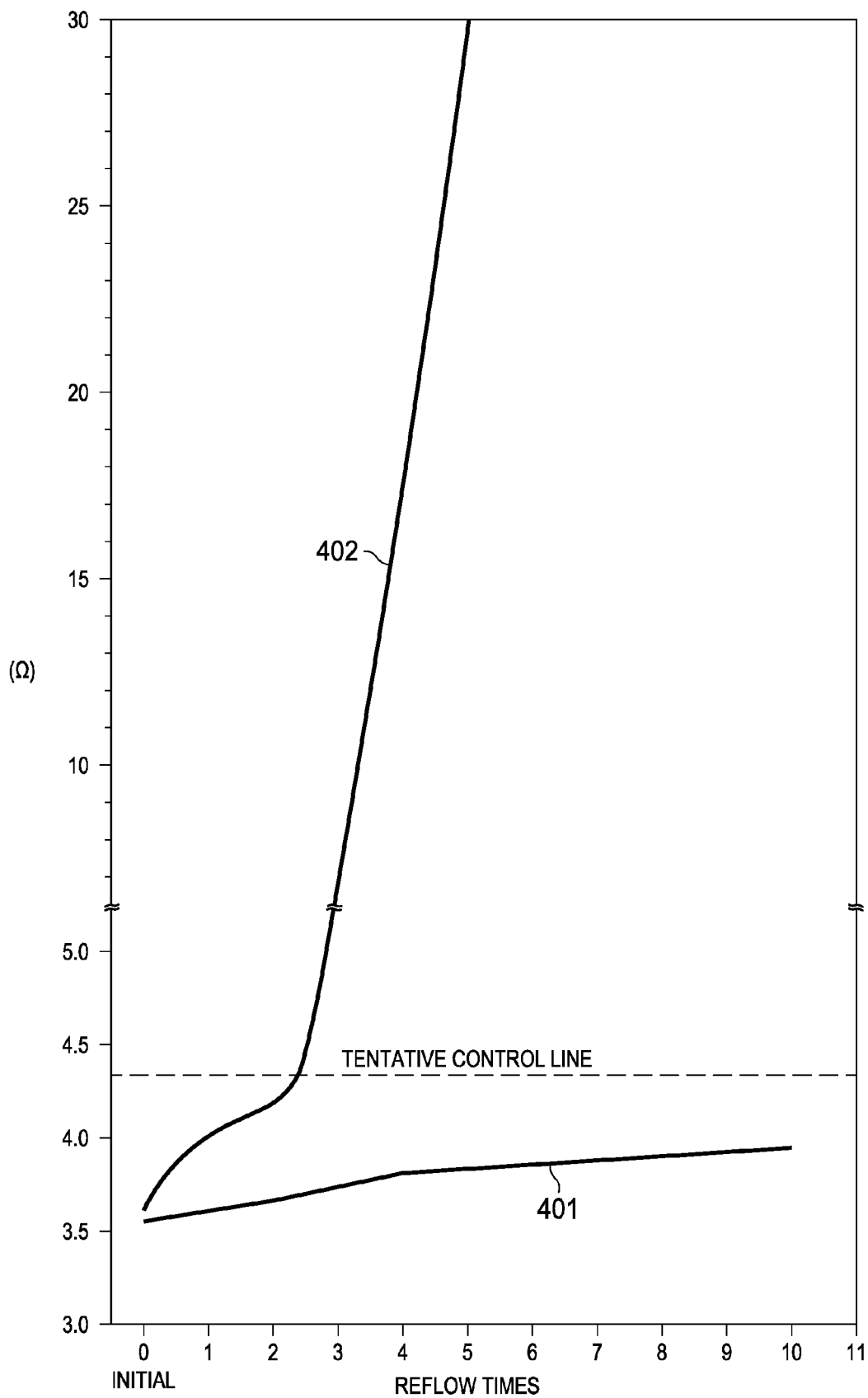
FIG. 4 shows an example of the performance data of devices manufactured according to the invention compared to devices manufactured with conventional methods, the data plotting the resistance of the chip studs assembled on the substrate as a function of repeated temperature cycles as encountered during solder reflow in product assembly.

The data are summarized in curve 401 of FIG. 4. Plotted is the average of the electrical resistance of the studs (in Ω) of 10 samples (A through J) as a function of the number of solder reflow cycles (from ambient temperature to 260° C. and back to ambient temperature). The data indicates an insignificant increase of the electrical resistance of only 5 to 9% after 10 temperature cycles and no electrical open.

In contrast, in standard technology (gold-to-copper attachment using solder), 50% or more of products suffer electrical opens already after only 5 temperature excursions between ambient temperature and 260° C. The data are illustrated in Table II, samples A through E.

TABLE II

Electrical Resistance (Ω) of Gold Studs Attached to Copper Pads, Conventional Technology

| Sample | Reflow Time | | | | | |
|---|---|---|---|---|---|---|
| | 0 | 1 | 2 | 3 | 4 | 5 |
| A | 3.6 | 4.1 | 4.3 | 7.8 | 18.8 | Open |
| B | 3.5 | 4.0 | 4.2 | 8.1 | 13.0 | 27.8 |
| C | 3.5 | 4.0 | 4.1 | 5.6 | Open | — |
| D | 3.7 | 4.1 | 4.3 | 4.4 | 4.5 | 16.8 |
| E | 3.7 | 4.1 | 4.6 | 8.0 | 18.8 | Open |

The data are summarized by curve 402 in FIG. 4, where the electrical resistance of the studs (in Ω) of 5 samples (A through E) is plotted as a function of the number of solder reflow cycles (from ambient temperature to 260° C. and back to ambient temperature). The data indicate an unacceptable resistance increase after only 3 cycles.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description.

As an example, the embodiments are effective in semiconductor devices and any other device with gold contacts, which have to undergo assembly on a substrate or printed circuit board with copper pads, sometimes followed by under filling the gap between device and substrate. As another example, the semiconductor devices may include substrates made of laminate plastics or printed circuit boards. As yet another example, the method of the invention is effective for any number of chip contacts and many semiconductor device technology nodes and not restricted to a particular one.

It is therefore intended that the appended claims encompass any such modifications or embodiments.

What is claimed is:

1. A semiconductor device comprising:
   a semiconductor chip having a plurality of gold studs;
   a substrate, on which the chip is assembled, having a first surface and a second surface;
      the a plurality of first surface having first copper contact pads covered with a continuous and conformal nickel layer; and
         at least one of the plurality of gold studs metallurgically attached to the nickel layer;
      the a plurality of second surface having second copper contact pads attached to an alloy layer, the alloy layer includes gold, copper-nickel-tin alloy and a dominant alloy portion comprising an $(CuNiAu)_6Sn_5$ intermetallic compound and is substantially free of unalloyed nickel; and
   a reflow body comprising tin metallurgically attached to the alloy layer of each of the plurality of second pads.

2. The device of claim 1 wherein the substrate is a single layer tape.

3. The device of claim 1 wherein the substrate is made of a polymide based polymer and has a thickness in the range from about 30 to 70 µm.

4. The device of claim 1 wherein the thickness of the nickel layer is between about 0.04 and 0.12 µm.

5. The device of claim 1 wherein the thickness of the alloy layer is between about 2.0 and 3.0 µm.

6. The device of claim 1 further including a polymeric precursor filling the space between the gold studs.

7. The device of claim 1 further including an encapsulation compound covering the chip and the first surface of the substrate.

8. A semiconductor device comprising:
   a semiconductor chip having a plurality of copper studs;
   a substrate, on which the chip is assembled, having a first surface and a second surface;
      the a plurality of first surface having first copper contact pads covered with a continuous and conformal nickel layer; and
         at least one of the plurality of copper studs metallurgically attached to the nickel layer;
      the a plurality of second surface having second copper contact pads attached to an alloy layer, the alloy layer includes gold, copper-nickel-tin alloy and a dominant alloy portion comprising an $(CuNiAu)_6Sn_5$ intermetallic compound and is substantially free of unalloyed nickel; and
   a reflow body comprising tin metallurgically attached to the alloy layer of each of the plurality of second pads.

9. The device of claim 8 wherein the substrate is a single layer tape.

10. The device of claim 8 wherein the substrate is made of a polyimide based polymer and has a thickness in the range from about 30 to 70 microns.

11. The device of claim 8 wherein the thickness of the nickel layer is between about 0.04 and 0.12 microns.

12. The device of claim 1 wherein the thickness of the alloy layer is between about 2.0 and 3.0 microns.

13. The device of claim 8 further including a polymeric precursor filling the space between the copper studs.

14. The device of claim 8 further including an encapsulation compound covering the chip and the first surface of the substrate.

* * * * *